(12) United States Patent    (10) Patent No.: US 12,068,662 B2
Mori                          (45) Date of Patent: Aug. 20, 2024

(54) ROTARY MECHANISM AND SUBSTRATE PROCESSING APPARATUS

(71) Applicant: Tokyo Electron Limited, Tokyo (JP)

(72) Inventor: Kiyoshi Mori, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 455 days.

(21) Appl. No.: 17/447,221

(22) Filed: Sep. 9, 2021

(65) Prior Publication Data

US 2022/0085693 A1    Mar. 17, 2022

(30) Foreign Application Priority Data

Sep. 17, 2020    (JP) .................................. 2020-156680

(51) Int. Cl.
*H02K 7/14*    (2006.01)
*C23C 16/458*    (2006.01)
*C23C 16/50*    (2006.01)

(52) U.S. Cl.
CPC ........... *H02K 7/14* (2013.01); *C23C 16/4584* (2013.01); *C23C 16/50* (2013.01)

(58) Field of Classification Search
CPC ............. H01J 21/6872; H01J 37/32715; H01J 2237/3321; H02K 7/14; C23C 16/4584

USPC .......................................................... 310/19
See application file for complete search history.

(56) References Cited

U.S. PATENT DOCUMENTS

| | | | | |
|---|---|---|---|---|
| 2,285,849 | A * | 6/1942 | Wallace | F02B 63/04 |
| | | | | 310/156.32 |
| 2019/0019715 | A1* | 1/2019 | Uefuji | H01L 21/6831 |
| 2019/0272991 | A1* | 9/2019 | Nguyen | H01J 37/3244 |
| 2021/0231129 | A1* | 7/2021 | Mason | F21V 33/0096 |

FOREIGN PATENT DOCUMENTS

| | | | | |
|---|---|---|---|---|
| EP | 1675152 | A2 * | 6/2006 | ............ H01J 35/106 |
| JP | 2003-046009 | A | 2/2003 | |
| JP | 2014-034997 | A | 2/2014 | |
| JP | 2014-134281 | A | 7/2014 | |

* cited by examiner

*Primary Examiner* — Terrance L Kenerly
(74) *Attorney, Agent, or Firm* — Armstrong Teasdale LLP

(57) ABSTRACT

A rotary mechanism connects a first rotary part and a second rotary part, without using a coupling and while allowing an installation error between the first rotary part and the second rotary part. A rotation body includes a first rotary part and a first fixed part. A flat plate is fixed to the first fixed part of the rotation body and has rigidity in a rotating direction of the first rotary part and flexibility in an axial direction for the rotating direction. A motor includes a second rotary part coaxially fixed to the first rotary part of the rotation body and a second fixed part fixed to the flat plate.

8 Claims, 6 Drawing Sheets

ROTARY MECHANISM AND SUBSTRATE PROCESSING APPARATUS

CROSS-REFERENCE TO RELATED APPLICATION

This application is based upon and claims the benefit of priority from Japanese Patent Application No. 2020-156680, filed on Sep. 17, 2020, the entire contents of which are incorporated herein by reference.

TECHNICAL FIELD

The present disclosure relates to a rotary mechanism and a substrate processing apparatus.

BACKGROUND

Patent Document 1 discloses a structure in which a rotary shaft of a rotary body and a shaft of a motor are directly connected by a coupling (a shaft joint).

PRIOR ART DOCUMENT

Patent Document

Patent Document 1: Japanese Laid-Open Patent Publication No. 2003-46009

SUMMARY

According to an embodiment of the present disclosure, a rotary mechanism includes a rotation body, a flat plate, and a motor. The rotation body includes a first rotary part and a first fixed part. The flat plate is fixed to the first fixed part of the rotation body and has rigidity in a rotating direction of the first rotary part and flexibility in an axial direction for the rotating direction. The motor includes a second rotary part coaxially fixed to the first rotary part of the rotation body and a second fixed part fixed to the flat plate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a rotary mechanism and a substrate processing apparatus disclosed herein will be described in detail with reference to the drawings. The rotary mechanism and a substrate processing apparatus disclosed herein are not limited by the following embodiments.

Conventionally, when a rotor (a first rotary part) of a rotary body and a shaft of a motor (a second rotary part) are connected to each other, the rotor and the shaft are connected to each other via a coupling in order to absorb an installation error such as misalignment (displacement). However, connecting via a coupling increases thickness of the connecting portion. In addition, responsiveness is reduced by interposing the coupling.

Therefore, a technique for connecting the first rotary part and the second rotary part without using a coupling while allowing an installation error between the first rotary part and the second rotary part is desired.

EMBODIMENTS

[Configuration of Substrate Processing Apparatus 100]

Figure 1:
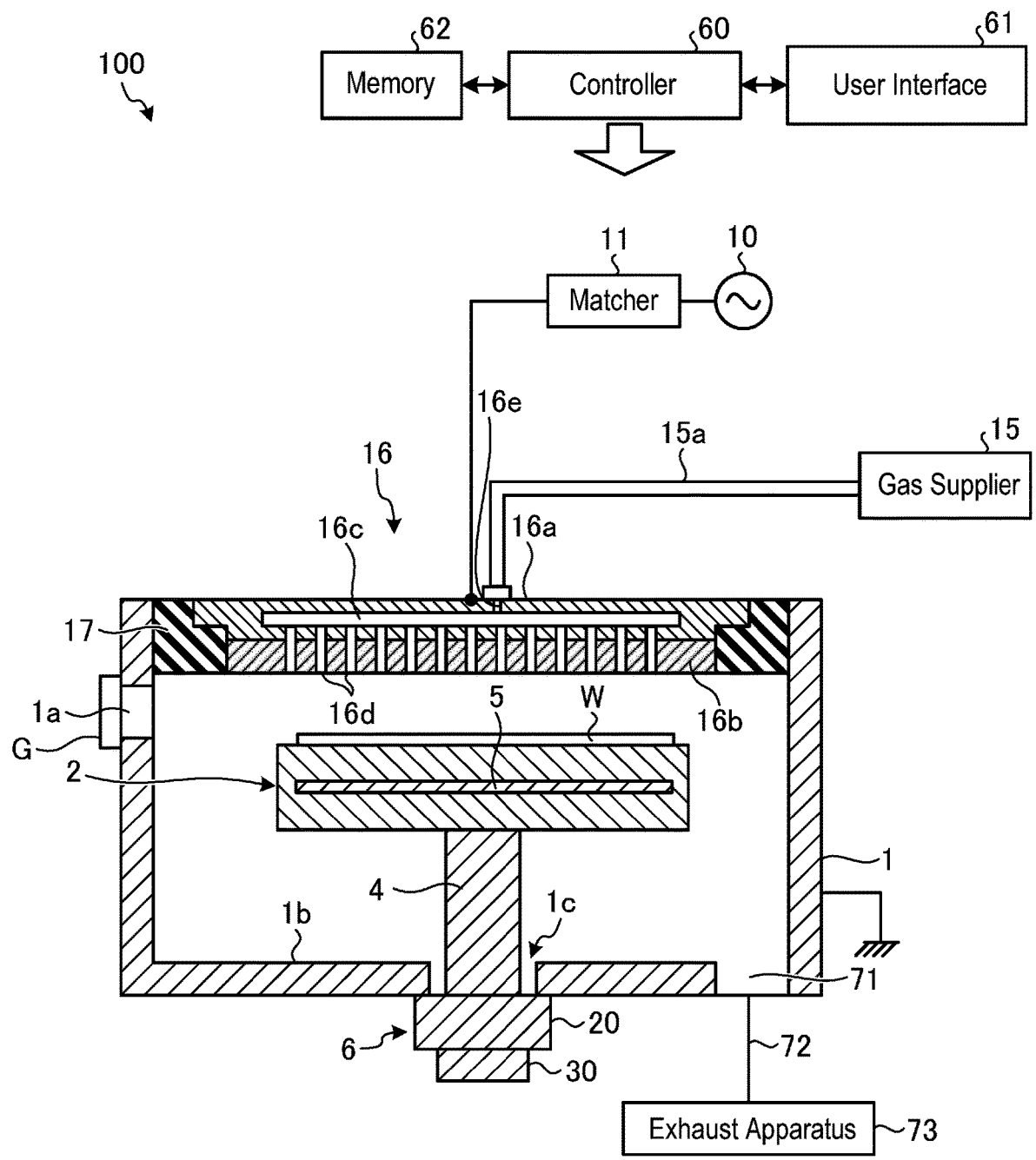
FIG. 1 is a cross-sectional view schematically illustrating an exemplary configuration of a substrate processing apparatus according to an embodiment.

An embodiment will be described. First, a substrate processing apparatus 100 according to an embodiment will be described. In the following, the case where the substrate processing apparatus 100 is used as an apparatus for forming a film will be described as an example. FIG. 1 is a cross-sectional view schematically illustrating an exemplary configuration of a substrate processing apparatus 100 according to a first embodiment.

In an embodiment, the substrate processing apparatus 100 is an apparatus that performs a plasma CVD process on a substrate W as substrate processing. The substrate processing apparatus 100 illustrated in FIG. 1 has a processing container 1. The processing container 1 is cylindrical, and is made of a metal such as aluminum or nickel having, for example, an anodized film formed on the surface thereof. The processing container 1 is electrically set to a ground potential. The processing container 1 is airtightly configured so that the inside thereof can be maintained in a vacuum atmosphere. The processing container 1 is provided with a stage 2 therein. The processing container 1 has an opening 1c formed in a bottom portion 1b which forms the lower bottom surface thereof. The opening 1c is formed at a position below the stage 2.

The stage 2 is formed in a flat cylinder shape. A substrate W to be processed, such as a semiconductor wafer, is placed on a top surface of the stage 2. The stage 2 supports the substrate W placed thereon substantially horizontally. The stage 2 is made of a metal such as aluminum or nickel, or aluminum nitride (AlN) in which a metal mesh electrode is embedded, and also functions as a lower electrode. The stage 2 is supported from the bottom side by a support member 4. The support member 4 is formed in a cylindrical shape, extends vertically downwards, and reaches the opening 1c in the bottom portion 1b of the processing container 1. The opening 1c in the bottom portion 1b is formed to have a diameter larger than the diameter of the support member 4. A gap is provided between the peripheral surface of the support member 4 and the peripheral surface of the opening 1c. The lower end portion of the support member 4 is provided with a rotary mechanism 6.

The rotary mechanism 6 is disposed so as to cover the opening 1c from the outside of the processing container 1 and to seal the opening 1c from the outside. The rotary mechanism 6 supports the support member 4. In addition, the rotary mechanism 6 is configured to be rotatable and to rotate the support member 4. The stage 2 rotates according to the rotation of the support member 4. A detailed configuration of the rotary mechanism 6 will be described later.

A heater 5 is built in the stage 2 so that it is possible to heat the substrate W placed on the stage 2 to a predetermined temperature using the heater 5. The stage 2 has therein a flow path (not illustrated) configured to circulate a coolant, and a temperature-controlled coolant may be circulated and supplied into the flow path by a chiller unit provided outside the processing container 1. The stage 2 may control the substrate W to a predetermined temperature by heating with the heater 5 and cooling with the coolant supplied from the chiller unit. The temperature of the stage 2 may be controlled only by the coolant and/or a heat medium supplied from the chiller unit without the heater 5.

An electrode may be embedded in the stage 2. The stage 2 may attract the substrate W placed on the top surface thereon by an electrostatic force generated by a DC voltage supplied to the electrode. In addition, the stage 2 is provided with lifting pins (not illustrated) for delivering a substrate W to and from a transport mechanism (not illustrated) provided outside the processing container 1.

A substantially disk-shaped shower head 16 is provided on the inner surface of the processing container 1 above the stage 2. The shower head 16 is supported above the stage 2 via an insulating member 17 such as ceramic. As a result, the processing container 1 and the shower head 16 are electrically insulated from each other. The shower head 16 is made of a conductive metal such as aluminum or nickel.

The shower head 16 has a ceiling plate member 16a and a shower plate 16b. The ceiling plate member 16a is provided so as to close the inside of the processing container 1 from the upper side. The shower plate 16b is provided below the ceiling plate member 16a so as to face the stage 2. A gas diffusion space 16c is formed in the ceiling plate member 16a. The ceiling plate member 16a and the shower plate 16b have a large number of gas ejection holes 16d distributed therein and opened towards the gas diffusion space 16c.

The ceiling plate member 16a has a gas inlet 16e configured to introduce various types of gases into the gas diffusion space 16c therethrough. A gas supply path 15a is connected to the gas inlet 16e. A gas supply part 15 is connected to the gas supply path 15a.

The gas supply part 15 includes gas supply lines, which are connected to respective gas supply sources of various gases used for film formation. Each gas supply line appropriately branches to correspond to a film forming process, and is provided with control devices for controlling a gas flow rate, such as a valve (e.g., an opening and closing valve) and a flow controller (e.g., a mass flow controller). The gas supply part 15 is configured to be capable of controlling the flow rates of various types of gases by controlling the control devices, such as an opening and closing valve and a flow controller provided in each gas supply line.

The gas supply part 15 supplies various types of gases used for film formation to the gas supply path 15a. For example, the gas supply part 15 supplies a raw-material gas for film formation to the gas supply path 15a. In addition, the gas supply part 15 supplies a purge gas or a reaction gas that reacts with the raw-material gas to the gas supply path 15a. The gas supplied to the gas supply path 15a is diffused in the gas diffusion space 16c and is ejected from each gas ejection hole 16d.

The space surrounded by the bottom surface of the shower plate 16b and the top surface of the stage 2 forms a processing space in which a film forming process is performed. In addition, the shower plate 16b is paired with the stage 2 grounded via the support member 4 and the processing container 1 to be configured as an electrode plate for forming capacitively coupled plasma (CCP) in the processing space. A high-frequency power supply 10 is connected to the shower head 16 via a matcher 11, and high-frequency power (RF power) is supplied from the high-frequency power supply 10 to the gas supplied to the processing space via the shower head 16, thereby forming the CCP. The high-frequency power supply 10 may be connected to the stage 2 instead of being connected to the shower head 16, and the shower head 16 may be grounded.

An exhaust port 71 is formed in the bottom portion of the processing container 1. An exhaust apparatus 73 is connected to the exhaust port 71 via an exhaust pipe 72. The exhaust apparatus 73 includes a vacuum pump and a pressure adjustment valve, and is configured to be capable of reducing the pressure inside the processing container 1 to a predetermined degree of vacuum by operating the vacuum pump and the pressure adjustment valve.

A side wall of the processing container 1 is provided with a carry-in and carry-out port 1a so as to load and unload a substrate W therethrough. A gate valve G is provided in the carry-in and out port 1a so as to open and close the carry-in and carry-out port 1a.

The substrate processing apparatus 100 configured as described above is controlled overall by the controller 60. A user interface 61 and a storage part 62 are connected to the controller 60.

The user interface 61 may be configured as an operation device, such as a keyboard, on which a process manager enters commands to manage the substrate processing apparatus 100, or a display part, such as a display that visualizes and displays the operating state of the substrate processing apparatus 100. The user interface 61 receives various operations. For example, the user interface 61 accepts a predetermined operation instructing start of plasma processing.

The storage part 62 stores programs (software) for implementing various processes performed in the substrate processing apparatus 100 under the control of the controller 60, or data such as processing conditions or process parameters. In addition, the programs or the data may be used in the state of being stored in a computer-readable computer storage medium (e.g., a hard disk, a CD, a flexible disk, a semiconductor memory, or the like). Alternatively, the programs or data may be transmitted from another device at any time via, for example, a dedicated line so as to be used online.

The controller 60 is, for example, a computer including a processor, a memory, or the like. The controller 60 reads a program or data from the storage part 62 based on an instruction from the user interface 61 or the like so as to control each part of the substrate processing apparatus 100, thereby executing each process of a control method to be described later.

[Configuration of Rotary Mechanism 6]

Figure 2:
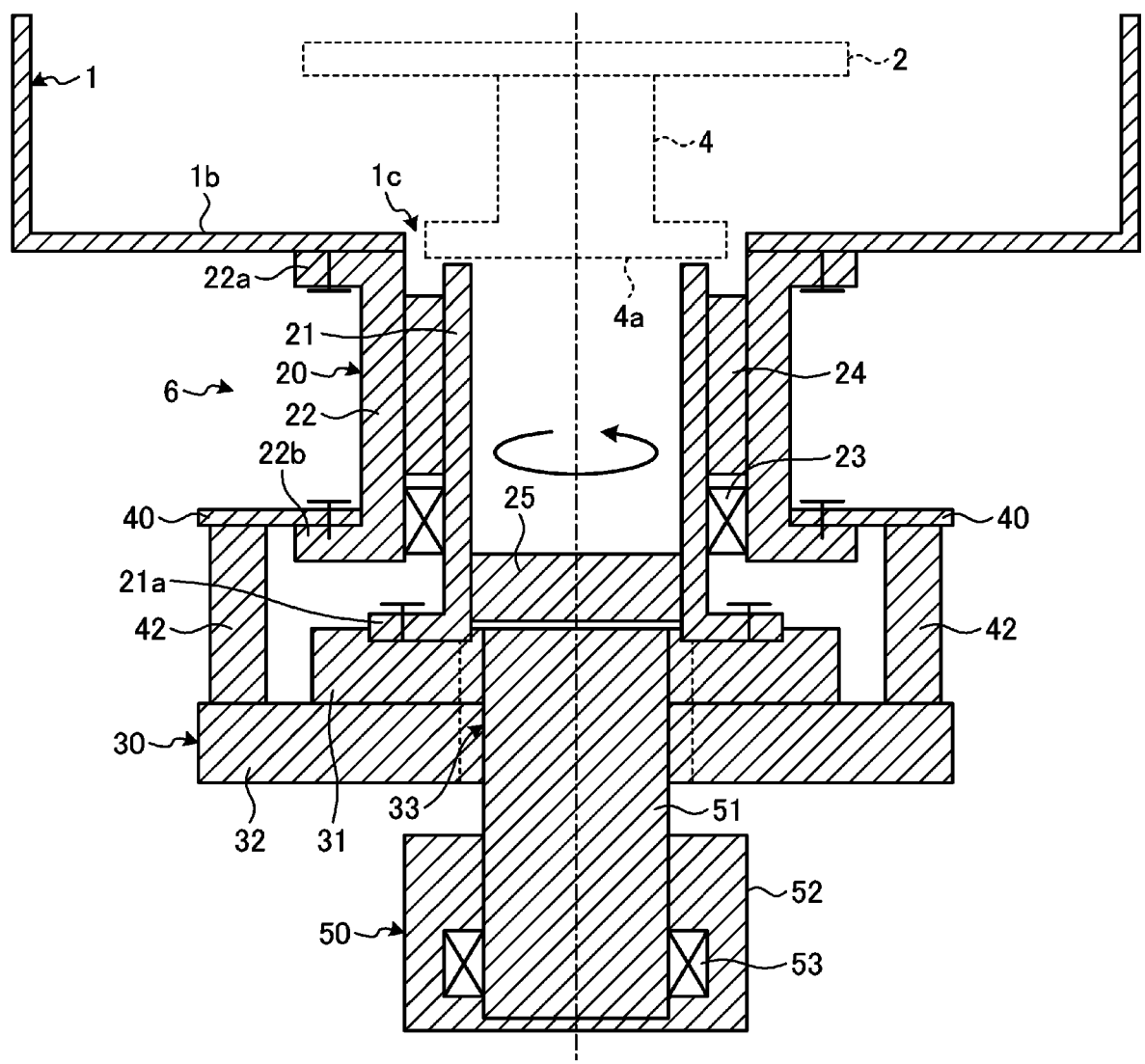
FIG. 2 is a cross-sectional view illustrating an exemplary configuration of a rotary mechanism according to an embodiment.
Figure 3:
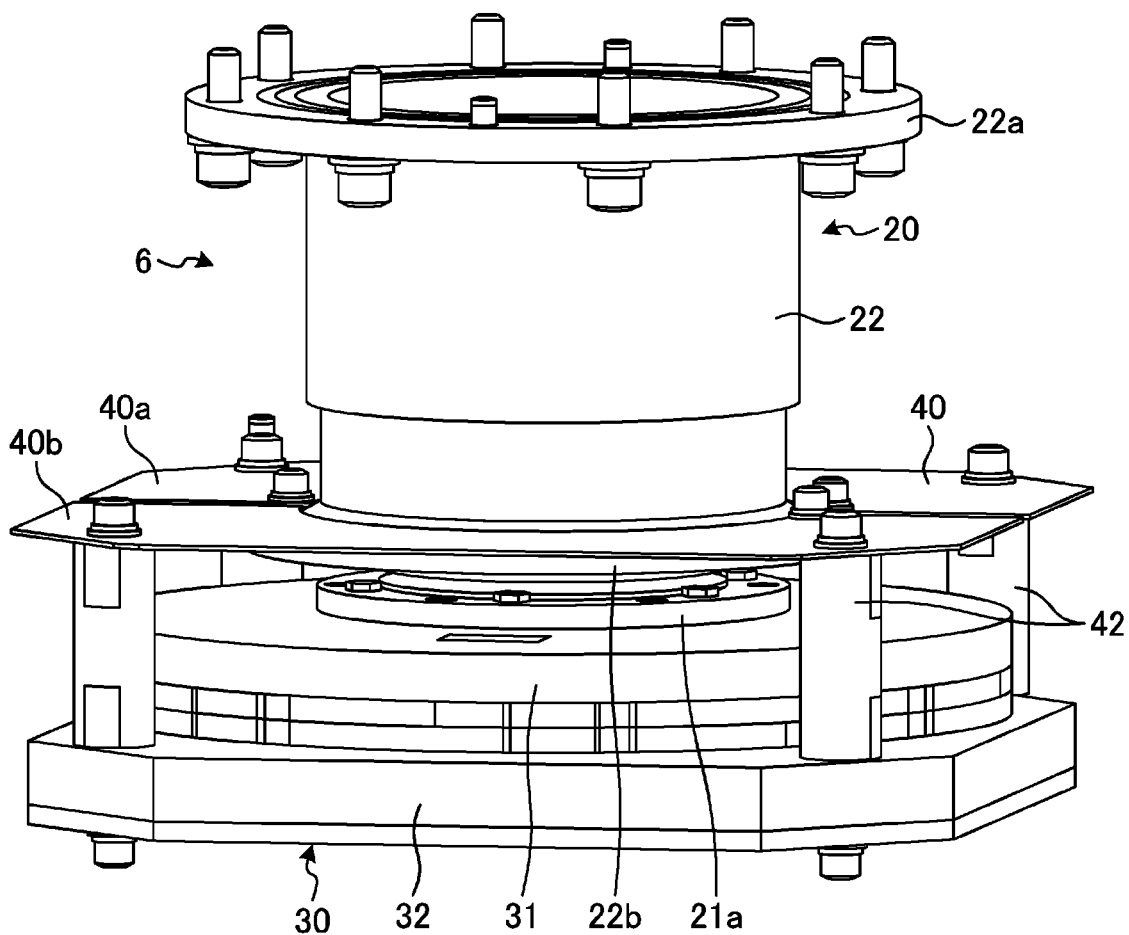
FIG. 3 is a perspective view schematically illustrating an exemplary configuration of a rotary mechanism according to an embodiment.

FIG. 2 is a cross-sectional view schematically illustrating an exemplary configuration of the rotary mechanism 6 according to an embodiment. FIG. 3 is a perspective view illustrating an exemplary configuration of the rotary mechanism 6 according to the embodiment. An opening 1c is formed in the bottom portion 1b of the processing container 1 to correspond to a position of the support member 4 for supporting the stage 2. The support member 4 is inserted into the opening 1c so as to support the stage 2 from the bottom side. The lower end portion 4a of the support member 4 is supported by the rotary mechanism 6.

The rotary mechanism 6 has a magnetic fluid seal 20 and a direct drive motor (hereinafter, also referred to as a "DD motor") 30.

The magnetic fluid seal 20 has a rotary shaft 21 and a casing 22. The magnetic fluid seal 20 is an example of the rotation body of the present disclosure. The rotary shaft 21 is an example of the first rotary part of the present disclosure. The casing 22 is an example of the first fixed part of the present disclosure.

The rotary shaft 21 is formed in a cylindrical shape having a hollow inside along the axis thereof. The casing 22 is formed in a cylindrical shape having an inner diameter larger than the outer shape of the rotary shaft 21, and covers the periphery of the rotary shaft 21. A bearing 23 is provided at the lower side of the inner peripheral surface of the casing 22, and the rotary shaft 21 is rotatably supported by the bearing 23. The casing 22 is provided with an annular permanent magnet and a sealing part 24 made of a magnetic material at the upper side of the rotary shaft 21 on the inner peripheral surface, and the sealing part 24 airtightly seals the gap between the casing 22 and the rotary shaft 21. The casing 22 has flanges 22a and 22b widening outwards at both upper and lower ends. The rotary shaft 21 has a flange 21a widening outwards at the lower end.

The magnetic fluid seal 20 is airtightly fixed by fastening the upper flange 22a to the bottom surface around the opening 1c in the bottom portion 1b of the processing container 1 via a sealing member such as an O-ring. In addition, the magnetic fluid seal 20 is fixed by fastening the rotary shaft 21 to the lower end portion 4a of the support member 4. The support member 4 and the rotary shaft 21 are provided with a wiring line (not illustrated) for supplying power to the heater 5 embedded in the stage 2. The rotary shaft 21 is provided with a hermetic seal 25 at the lower end portion of the hollow inside thereof, and the lower end portion is airtightly sealed by the hermetic seal 25. The hermetic seal 25 is provided with an electrode (not illustrated) connected to the wiring line for supplying power to the heater 5. The magnetic fluid seal 20 is capable of supplying electric power to the wiring line that supplies power to the heater 5 via the electrode provided in the hermetic seal 25.

The DD motor 30 has a rotary rotor 31 and a motor base 32. The DD motor 30 is an example of the motor of the present disclosure. The rotary rotor 31 is an example of the second rotary part of the present disclosure. The motor base 32 is an example of the second fixed part of the present disclosure. The DD motor 30 is provided with the rotary rotor 31 on one surface of the flat plate-shaped motor base 32, and the rotary rotor 31 rotates under the control of the controller 60. The DD motor 30 is capable of obtaining a high torque at a low speed compared with a general servo motor. In the DD motor 30, a circular through hole 33 is formed in the rotary rotor 31 and the motor base 32 along the rotation axis.

Conventionally, when the rotary shaft 21 of the magnetic fluid seal 20 and the rotary rotor 31 of the DD motor 30 are connected to each other, the rotary shaft 21 and the rotary rotor 31 are connected via a coupling in order to absorb an installation error such as misalignment (displacement). However, since the connecting portion between the rotary shaft 21 and the rotary rotor 31 becomes thicker due to the connection via the coupling, it becomes difficult to save space. In addition, responsiveness is reduced by interposing the coupling.

Therefore, in the present embodiment, the rotary shaft 21 and the rotary rotor 31 are connected as follows.

In the present embodiment, the rotary shaft 21 of the magnetic fluid seal 20 and the rotary rotor 31 of the DD motor 30 are coaxially fastened and fixed. In addition, the casing 22 of the magnetic fluid seal 20 and the motor base 32 of the DD motor 30 are fixed via a flat plate 40.

The flat plate 40 is fixed to the casing 22 of the magnetic fluid seal 20. In the embodiment, the flat plate 40 is fixed to the flange 22b of the casing 22 by fastening at a plurality of locations.

In addition, the motor base 32 of the DD motor 30 is fixed to the flat plate 40 via columnar parts 42 at a plurality of locations. In the embodiment, the columnar parts 42 are provided at four locations on the motor base 32 surrounding the rotary rotor 31 and fixed to the flat plate 40.

The flat plate 40 has rigidity with respect to the rotating direction of the rotary rotor 31 and flexibility with respect to the axial direction with respect to the rotating direction of the rotary rotor 31. For example, the flat plate 40 is made of a material having a Young's modulus of 70 to 200 GPa and has a thickness of 0.5 to 2.0 mm. For example, the flat plate 40 is formed to have a thickness of 0.5 to 1.0 mm when the material of the flat plate 40 is stainless steel or iron, the surface of which is plated. In addition, the flat plate 40 is formed to have a thickness of 1.0 to 2.0 mm when the material is aluminum.

Even if the flat plate 40 formed in this manner is a thin plate, the rigidity thereof is high against an external force in the in-plane direction, such as the rotating direction of the DD motor 30. As a result, the flat plate 40 is capable of fixing the motor base 32 and the casing 22 with respect to the rotating direction of the rotary rotor 31 even if the rotary rotor 31 of the DD motor 30 is rotated. In addition, the rigidity of the flat plate 40 is decreased against an external force at an angle different from the in-plane direction (when a component perpendicular to the surface is included). As a result, even if there is an installation error such as misalignment (displacement) between the rotary shaft 21 of the magnetic fluid seal 20 and the rotary rotor 31 of the DD motor 30, the flat plate 40 is capable of being deformed in the axial direction according to the force generated by the installation error, thereby absorbing the installation error. For example, the flat plate 40 is capable of absorbing misalignment of about several hundred μm. In addition, the flat plate 40 is capable of being deformed in the axial direction, thereby flexibly absorbing a minute displacement such as vibration when the rotary rotor 31 of the DD motor 30 is rotated.

Further, the flat plate 40 may be divided into a plurality of portions, and each of the divided portions may be fixed to the motor base 32 of the DD motor 30. As illustrated in FIG. 3, the flat plate 40 according to the embodiment is divided into two flat plates 40a and 40b at the center in one direction. The flat plates 40*a* and 40*b* are each fixed to the motor base 32. By being divided, the flat plates 40*a* and 40*b* are improved in flexibility in the axial direction at the end portions in the divided directions, which makes it possible to improve followability. The number of divisions of the flat plate 40 is not limited to two, and may be three or more. In addition, the direction in which the flat plate 40 is divided is not limited to one direction, and may be divided in a direction intersecting the one direction. For example, the flat plate 40 may be divided vertically and horizontally in a grid pattern into four flat plates.

In addition, any fixing method may be used as long as the flat plate 40 can be fixed to the motor base 32 so as not to rotate. For example, the flat plate 40 may be fixed to the motor base 32 at a plurality of places using fixing members such as screws. In addition, the flat plate 40 may be provided with engagement portions such as notches, and the engagement portions may be engaged with the motor base 32 so as to fix the same.

As described above, the rotary mechanism 6 according to the embodiments allows the rotary shaft 21 and the rotary rotor 31 to be connected to each other, without using a coupling, and by allowing an installation error between the rotary shaft 21 of the magnetic fluid seal 20 and the rotary rotor 31 of the DD motor 30. In addition, since the rotary mechanism 6 according to the embodiment does not use a coupling, it is possible to reduce the thickness of the connecting portion between the rotary shaft 21 and the rotary rotor 31. In addition, the rotary mechanism 6 according to the embodiment, in order to directly fix the rotary shaft 21 and the rotary rotor 31, can connect with good responsiveness.

A slip ring 50 is arranged in the through hole 33 of the DD motor 30. Electric power is supplied to the heater 5 or the electrode provided in the stage 2 via the slip ring 50. For example, the slip ring 50 has a rotary part 51 and a fixed part 52. The rotary part 51 is formed in a columnar shape, and has an electrode formed at the tip thereof. The fixed part 52 is provided with a bearing 53, and rotatably supports the rotary part 51 using the bearing 53. The rotary part 51 passes through the through hole 33 and is directly or indirectly fixed to the rotary shaft 21 so as to rotate together with the rotary shaft 21. The electrode at the tip of the rotary part 51 comes into contact with the electrode provided in the hermetic seal 25 of the rotary shaft 21 to be electrically connected to the electrode provided in the hermetic seal 25 of the rotary shaft 21. The rotary part 51 is provided with a ring-shaped electrode, which is connected to the electrode at the tip via a wiring line, on the outer peripheral surface facing the fixed part 52. The fixed part 52 is provided with a brush at a position corresponding to the ring-shaped electrode on the inner peripheral surface facing the rotary part 51. In the slip ring 50, the ring-shaped electrode on the outer peripheral surface of the rotary part 51 and the brush on the inner peripheral surface of the fixed part 52 come into contact with each other, whereby the rotary part 51 and the fixed part 52 are electrically connected to each other even when the rotary part 51 rotates. An electrode connected to the brush via a wiring line is provided on the outer surface of the fixed part 52, and a feeding line for supplying power to the heater 5 is connected to the electrode. Electric power is supplied to the heater 5 via the slip ring 50, the rotary shaft 21 of the magnetic fluid seal 20, and the support member 4.

[Installation Procedure of Rotary Mechanism 6]

Figure 4:
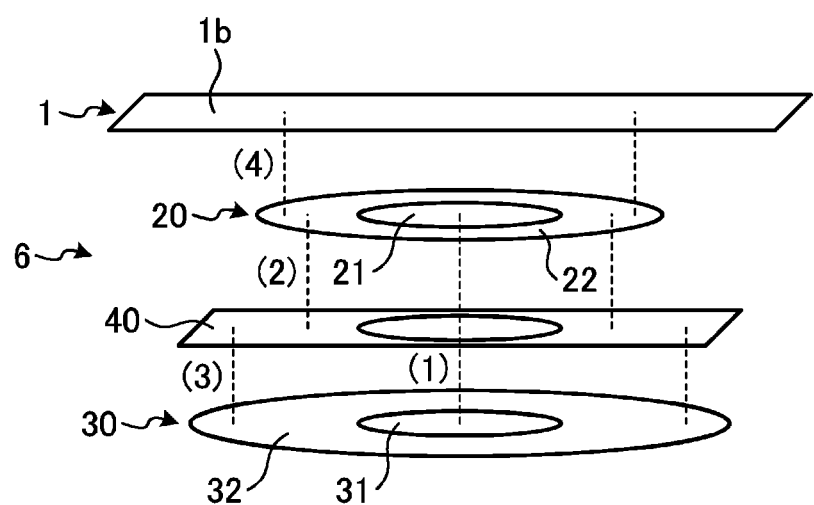
FIG. 4 is a view illustrating an installation procedure of a rotary mechanism according to an embodiment.

Next, an installation procedure for installing the rotary mechanism 6 according to the embodiments to the substrate processing apparatus 100 will be described. FIG. 4 is a view illustrating a procedure of installing the rotary mechanism 6 according to an embodiment. FIG. 4 briefly illustrates the bottom portion 1*b* of the processing container 1, the magnetic fluid seal 20, the flat plate 40, and the DD motor 30.

The rotary mechanism 6 is installed to the bottom portion 1*b* of the processing container 1 from (1) to (4) described below.

(1) The rotary shaft 21 of the magnetic fluid seal 20 and the rotary rotor 31 of the DD motor 30 are coaxially fastened and fixed. It is possible to easily align the positions of the rotary shaft 21 and the rotary rotor 31 by installing the rotary shaft 21 and the rotary rotor 31 first. By fixing the rotary shaft 21 and the rotary rotor 31, the DD motor 30 is supported by the magnetic fluid seal 20.

(2) The flat plate 40 is fastened and fixed to the casing 22 of the magnetic fluid seal 20 at a plurality of locations.

(3) The motor base 32 of the DD motor 30 is fixed to a plurality of places on the flat plate 40 via the columnar parts 42.

(4) The casing 22 of the magnetic fluid seal 20 is fixed to the bottom portion 1*b* of the processing container 1.

The installation procedure from (1) to (4) is as follows: after the magnetic fluid seal 20, the flat plate 40, and the DD motor 30 of the rotary mechanism 6 are unitized as the rotary mechanism 6 in (2) and (3), and the unitized rotary mechanism 6 is installed to the bottom portion 1*b* of the processing container 1 in (4). Since it is possible to perform operations of (2) and (3) at a place other than the lower portion of the processing container 1, the installation procedure from (1) to (4) is capable of reducing operations performed at the lower part of the processing container 1.

The order of installation procedure from (1) to (4) described above is an example, and is not limited thereto. For example, the operations (2) and (3) may be changed. In addition, operation (4) may be performed before operation (1).

Here, for example, it is conceivable to fasten and fix the rotary shaft 21 and the rotary rotor 31 such that there is no installation error by performing high-precision centering such that the rotary shaft 21 of the magnetic fluid seal 20 and the rotary axis of the rotary rotor 31 of the DD motor 30 coincide with each other. In this case, after performing centering, the casing 22 of the magnetic fluid seal 20 and the motor base 32 of the DD motor 30 are fixed using a highly rigid coupling member such that no misalignment is caused. However, high-precision centering requires adjustment jigs, an operation space for arranging the adjustment jigs or the like so as to perform operations, and increases the number of assembly steps until the rotary mechanism 6 is installed to the processing container 1. In addition, since it is necessary to fix the casing 22 of the magnetic fluid seal 20 and the motor base 32 of the DD motor 30 using a highly rigid coupling member, it is not possible to easily attach and detach the casing 22 and the motor base 32.

In contrast, the rotary mechanism 6 according to the embodiments is capable of absorbing an installation error between the rotary shaft 21 of the magnetic fluid seal 20 and the rotary rotor 31 of the DD motor 30 using the flat plate 40. As a result, the rotary mechanism 6 according to the embodiments allows the rotary shaft 21 and the rotary rotor 31 to be connected to each other, without performing high-precision centering of the rotary shaft 21 and the rotary rotor 31, while allowing an installation error between the rotary shaft 21 and the rotary rotor 31. As a result, with the rotary mechanism 6 according to the embodiments, it is possible to reduce the number of assembly steps. Further, it is possible to easily attach and detach the rotary mechanism 6 according to the embodiments.

[Effect]

As described above, the rotary mechanism 6 according to the embodiments includes the magnetic fluid seal 20 (the rotation body), the flat plate 40, and the DD motor 30 (the motor). The magnetic fluid seal 20 includes the rotary shaft 21 (the first rotary part) and the casing 22 (the first fixed part). The flat plate 40 is fixed to the casing 22 of the magnetic fluid seal 20, has rigidity in the rotating direction of the rotary shaft 21, and has flexibility in the axial direction for the rotating direction. The DD motor 30 includes the rotary rotor 31 (the second rotary part) coaxially fixed to the rotary shaft 21 of the magnetic fluid seal 20, and the motor base 32 (the second fixed part) fixed to the flat plate 40. As a result, the rotary mechanism 6 according to the embodiments allows the rotary shaft 21 and the rotary rotor 31 to be connected to each other, without using a coupling, and by allowing an installation error between the rotary shaft 21 and the rotary rotor 31. As a result, with the rotary mechanism 6 according to the embodiments, it is possible to reduce the thickness of the connecting portion between the rotary shaft 21 and the rotary rotor 31. In addition, the rotary mechanism 6 according to the embodiments, in order to directly fix the rotary shaft 21 and the rotary rotor 31, can connect with good responsiveness.

In addition, the flat plate 40 is divided into a plurality of plates, each of which is fixed to the casing 22 of the magnetic fluid seal 20. This makes it possible to improve the flexibility of the flat plate 40, and thus improving followability.

The flat plate 40 has a thickness of 0.5 to 2.0 mm. In addition, the flat plate 40 is formed of a material having a Young's modulus of 70 to 200 GPa. This makes it possible for the flat plate 40 to have rigidity that enables the motor base 32 and the casing 22 to be fixed in the rotating direction. In addition, this makes it possible for the flat plate 40 to have flexibility that is capable of absorbing an installation error.

In addition, the motor base 32 of the DD motor 30 is fixed to the flat plate 40 via the columnar parts 42 at a plurality of locations. As a result, it is possible to fix the motor base 32 to the flat plate 40 at a distance from the flat plate 40.

Although embodiments have been described above, it should be considered that the embodiments disclosed herein are illustrative and are not restrictive in all respects. In addition, the embodiments described above may be omitted, replaced, or modified in various forms without departing from the scope and spirit of the claims.

For example, in the embodiments described above, an example in which the rotation body of the rotary mechanism 6 is a magnetic fluid seal 20 and the motor is a DD motor 30 has been described. However, the technique disclosed herein is not limited thereto. The rotation body may be any one, as long as it has a rotating rotary part and a fixed portion that rotatably holds the rotary part. The motor may also be any motor, as long as it has a rotating rotary part and a fixed part that rotatably holds the rotary part.

Further, in the embodiments described above, an example in which the motor base 32 and the flat plate 40 are fixed to each other via the columnar parts 42 has been described. However, the technique disclosed herein is not limited thereto. At least one of a floating joint and a rubber bush may be provided in at least one of the space between the columnar parts 42 and the flat plate 40 and the space between the columnar parts 42 and the motor base 32.

Figure 5:
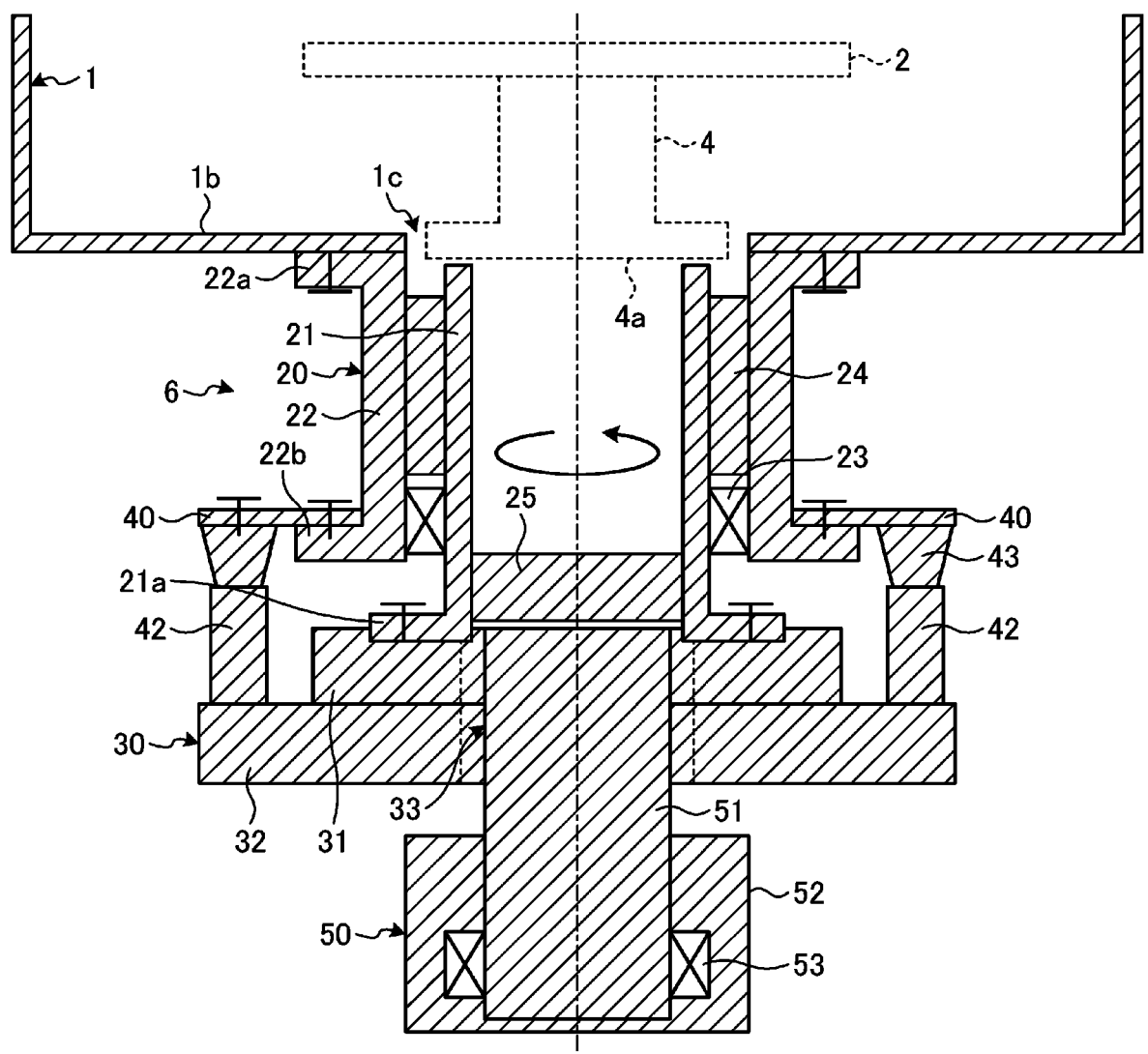
FIG. 5 is a cross-sectional view schematically illustrating an exemplary configuration of a rotary mechanism according to another embodiment.

FIG. 5 is a cross-sectional view schematically illustrating an exemplary configuration of the rotary mechanism 6 according to another embodiment. FIG. 5 illustrates the case where rubber bushes 43 are provided on respective columnar parts 42 at the side of the flat plate 40. The rubber bushes 43 may be provided on the respective columnar parts 42 at the side of the motor base 32. The rubber bushes 43 are formed to include rubber so as to be elastic. By being provided with the rubber bushes 43, the rotary mechanism 6 is capable of absorbing the vibration in a direction perpendicular to the rotary axis direction of the DD motor 30 with the rubber bushes 43. In addition, the rotary mechanism 6 is capable of absorbing the vibration in the rotary axis direction of the DD motor 30 with the flat plate 40.

Figure 6:
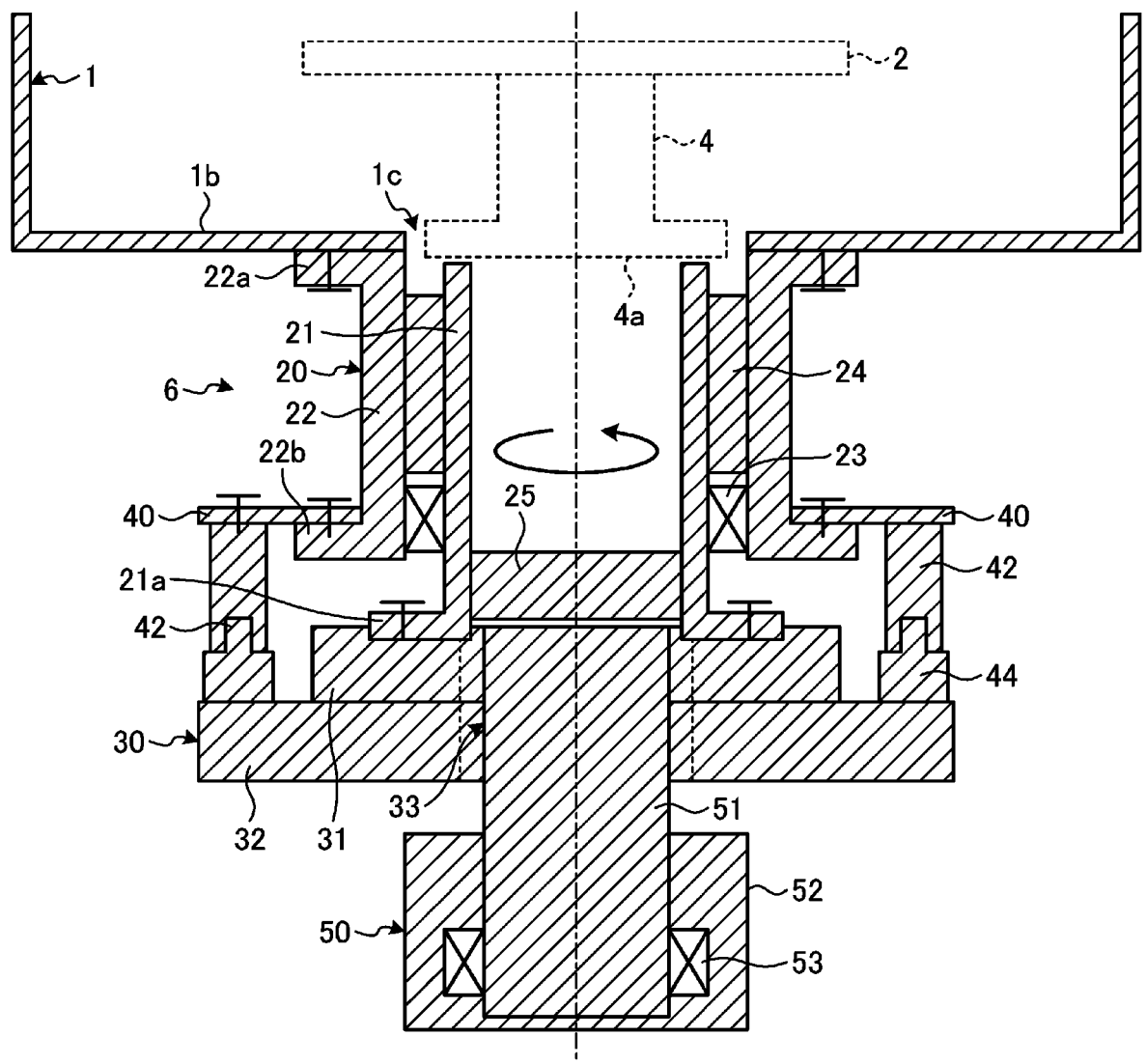
FIG. 6 is a cross-sectional view schematically illustrating an exemplary configuration of a rotary mechanism according to another embodiment.

FIG. 6 is a cross-sectional view schematically illustrating an exemplary configuration of the rotary mechanism 6 according to another embodiment. FIG. 6 illustrates the case where floating joints 44 are provided on respective columnar parts 42 at the side of the motor base 32. The floating joints 44 may be provided on the columnar parts 42 at the side of the flat plate 40. The floating joints 44 are capable of changing the angle of the joint portion. By being provided with the floating joints 44, the rotary mechanism 6 is capable of absorbing the vibration in a direction perpendicular to the rotary axis direction of the DD motor 30 with the floating joints 44. In addition, the rotary mechanism 6 is capable of absorbing the vibration in the rotary axis direction of the DD motor 30 with the flat plate 40.

In the embodiments described above, an example in which the substrate processing apparatus 100 having the rotary mechanism 6 is used as an apparatus for performing a plasma CVD process as a substrate process has been described. However, the technique disclosed herein is not limited thereto. The substrate processing apparatus having the rotary mechanism 6 may be any apparatus, as long as it is an apparatus configured to rotate a stage 2 on which a substrate W is placed. The technique may be applied to any apparatus that performs other substrate processes such as plasma etching. That is, the technique disclosed herein may be adopted in any processing apparatus. For example, the substrate processing apparatus 100 may be any type of plasma processing apparatus, such as a capacitively coupled plasma (CCP) type apparatus, an inductively coupled plasma (ICP) type apparatus, or a plasma processing apparatus that excites gas using surface waves such as microwaves. In addition, the substrate processing apparatus 100 may be a processing apparatus that does not use plasma.

According to the present disclosure, it is possible to connect a first rotary part and a second rotary part, without using a coupling, and by allowing an installation error between the first rotary part and the second rotary part.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A rotary mechanism comprising:
   a rotation body including a first rotary part and a first fixed part;

a flat plate fixed to the first fixed part of the rotation body and having rigidity in a rotating direction of the first rotary part and flexibility in an axial direction for the rotating direction; and a motor including a second rotary part coaxially fixed to the first rotary part of the rotation body and a second fixed part fixed to the flat plate, wherein the flat plate has a thickness of 0.5 to 2.0 mm, and wherein the flat plate is formed of a material having a Young's modulus of 70 to 200 GPa.

2. The rotary mechanism of claim 1, wherein the rotation body is a magnetic fluid seal and the motor is a direct drive motor.

3. The rotary mechanism of claim 2, wherein the flat plate is divided into a plurality of portions, each of which is fixed to the first fixed part of the rotation body.

4. The rotary mechanism of claim 3, wherein the second fixed part of the motor is fixed to the flat plate at a plurality of locations via columnar parts.

5. The rotary mechanism of claim 4, wherein at least one of a floating joint or a rubber bush is provided in at least one of a space between the columnar parts and the flat plate or a space between the columnar parts and the second fixed part.

6. The rotary mechanism of claim 1, wherein the flat plate is divided into a plurality of portions, each of which is fixed to the first fixed part of the rotation body.

7. The rotary mechanism of claim 1, wherein the second fixed part of the motor is fixed to the flat plate at a plurality of locations via columnar parts.

8. A substrate processing apparatus comprising:

a rotary mechanism of claim 1; and a stage configured to be rotated by the rotary mechanism while a substrate to be processed is placed thereon.

* * * * *